United States Patent [19]

Muraoka

[11] Patent Number: 5,446,542
[45] Date of Patent: Aug. 29, 1995

[54] MARK POSITION DETERMINING APPARATUS FOR USE IN EXPOSURE SYSTEM

[75] Inventor: Yukihiro Muraoka, Yamagata, Japan

[73] Assignee: NEC Corporation, Japan

[21] Appl. No.: 26,486

[22] Filed: Mar. 4, 1993

[30] Foreign Application Priority Data

Mar. 4, 1992 [JP] Japan .................. 4-046502

[51] Int. Cl.$^6$ .................. G01J 1/20; G01N 21/47
[52] U.S. Cl. .................. 356/400; 250/548; 356/399
[58] Field of Search .................. 356/399–401; 250/548

[56] References Cited

U.S. PATENT DOCUMENTS

| | | | |
|---|---|---|---|
| 4,659,227 | 4/1987 | Sato et al. | 356/401 |
| 4,795,260 | 1/1989 | Schnur et al. | 356/400 |
| 5,114,236 | 5/1992 | Matsugu et al. | 356/400 |
| 5,218,193 | 6/1993 | Miyatake | 356/401 |

OTHER PUBLICATIONS

"An Advanced H–Line Stepper", Solid State Technology/Jan. 1987, Jere D. Buckley, pp. 87–93.

*Primary Examiner*—Robert P. Limanek
*Assistant Examiner*—Alexander Oscar Williams
*Attorney, Agent, or Firm*—Laff, Whitesel, Conte & Saret, Ltd.

[57] ABSTRACT

A mark position determining apparatus used in an exposure system includes a laser light source for projecting a laser beam onto an alignment mark which is formed on a substrate to be exposed with a pattern and which has a center flat surface and a pair of side surfaces. A spatial filter is located to shield a light reflected from the center flat surface of the alignment mark. But, the spatial filter has a pair of windows allowing passage of all scattered lights reflected from the side surfaces of the alignment mark even if a size and/or shape of the alignment mark vary. An image sensor is located to receive the scattered lights which have passed through the spatial filter, so as to generate an image signal. An image processor receives the image signal for obtaining a light intensity distribution of the image signal, and for discriminating whether or not a plurality of light intensity peaks included in the obtained light intensity distribution are substantially in symmetry. The image processor also operates to determine that a symmetry point is a center position of the alignment mark when the light intensity peaks are substantially in symmetry.

4 Claims, 6 Drawing Sheets

MARK POSITION DETERMINING APPARATUS FOR USE IN EXPOSURE SYSTEM

BACKGROUND OF THE INVENTION

1. Field of the Invention

The present invention relates to an exposure system for printing a pattern on a substrate such as a semiconductor wafer and a plate for a liquid crystal, and more specifically to a mark position determining apparatus used in such an exposure system for the purpose of attaining alignment between the substrate and for example a projected pattern of a reticle.

2. Description of Related Art

In this type of exposure system, before a pattern is actually printed, a preparation operation is performed for each of substrates in order to precisely position a substrate in relation to the exposure system. Conventionally, this preparation operation includes the steps of irradiating a detecting light (laser beam) through a condenser lens to an alignment mark on a wafer, and guiding a reflected light to a detecting optical system, where the reflected light is detected by an image sensor and converted into an image signal. A waveform of the image signal obtained is compared to a predetermined slice level, in order to determine a position of the alignment mark. In this case, a method for introducing the reflected light to the detecting optical system is divided into a bright-field alignment system and a dark-field alignment system.

This position determining apparatus is called a "stepper" in the field of a semiconductor device manufacturing. An overview of one recent stepper is made in "An Advanced H-Line Stepper" by Jere D Buckley, Solid State Technology, January 1987, pages 87–93. The content of this paper is incorporated therein with reference thereto.

In the dark-field alignment system, for example, a spatial filter is located before the image sensor so as to block a light reflected from a center flat surface of the alignment mark but to pass scattered lights reflected from a pair of side surfaces of the alignment mark. In other words, the spatial filter is composed of a shield plate having small windows which allow passage of only the scattered lights from the side surfaces of the alignment mark.

However, if the alignment mark has a different shape, the direction of the scattered light correspondingly changes. In some cases, the scattered light reflected from the side surfaces of the alignment mark is almost or completely blocked by the spatial filter, with the result that a sufficient amount of scattered light does not enter to the image sensor, or no scattered light enters to the image sensor.

Since all wafers do not necessarily have alignment marks of the same shape and the same size, namely, since there is possibility that a number of wafers have alignment marks of different shapes and/or sizes, the conventional mark position determining apparatus has been disadvantageous in that (1) it is in some cases that the position determining operation cannot be performed because a sufficient amount of scattered light is not obtained, (2) a light intensity spectrum of the detected scattered light is vague in some cases, and therefore, the S/N ratio of the image signal obtained is low, so that the side surface detection precision is deteriorated, and a long time is required for the position determining operation, and (3) because the position determining accuracy is deteriorated, the position determining operation often fails and one or more additional position determining operations must be performed.

SUMMARY OF THE INVENTION

Accordingly, it is an object of the present invention to provide a mark position determining apparatus which can be used in an exposure system and which has overcome the above mentioned defect of the conventional one.

Another object of the present invention is to provide a mark position determining apparatus which can be used in an exposure system and which can properly determine a mark position with a short time even if an alignment mark has a different shape or size, so that the mark position determining can be precisely performed in the exposure system.

The above and other objects of the present invention are achieved in accordance with the present invention by a mark position determining apparatus including a means for projecting a light onto a mark which is formed on a substrate and which has a center flat surface and a pair of side surfaces, a spatial filter located to shield a light reflected from the center flat surface of the mark, the spatial filter having a pair of windows allowing passage of substantially all scattered lights reflected from the side surfaces of the mark even if a size and/or shape of the mark vary, an image sensor located to receive the scattered lights which have passed through the spatial filter, so as to generate an image signal, and an image processor receiving the image signal for obtaining a light intensity distribution of the image signal, and for discriminating whether or not a plurality of light intensity peaks included in the obtained light intensity distribution are substantially in symmetry, the image processor operating to determine that a symmetry point is a center position of the mark when the light intensity peaks are substantially in symmetry, The above and other objects, features and advantages of the present invention will be apparent from the following description of preferred embodiments of the invention with reference to the accompanying drawings.

DESCRIPTION OF THE PREFERRED EMBODIMENTS

Figures 1A, 1D:
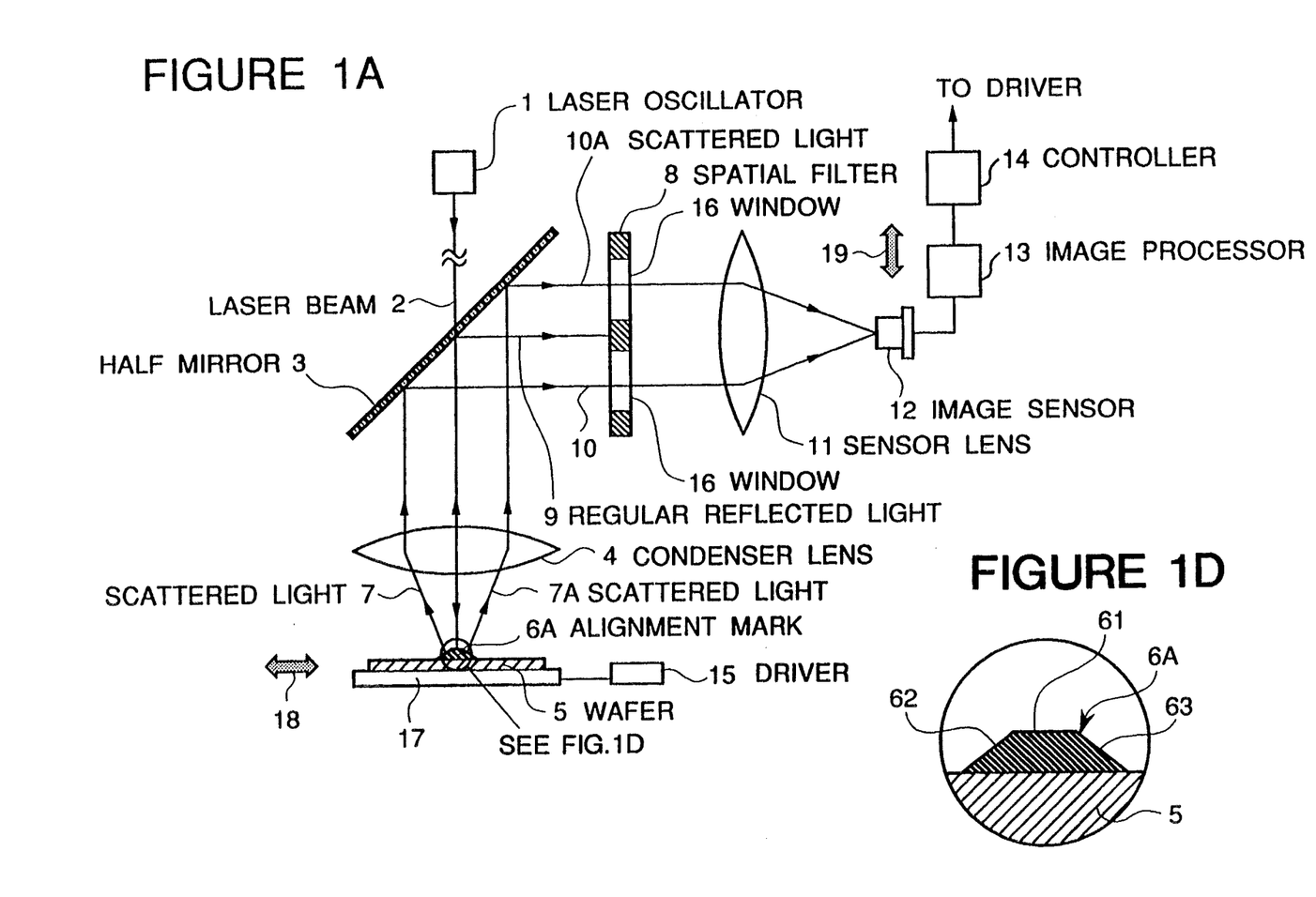
FIGS. 1A, 1B and 1C are diagrams of one embodiment of the mark position determining apparatus in accordance with the present invention, in which a wafer having a different alignment mark is placed.
FIGS. 1D, 1E and 1F are details of the structure shown in small circles in FIGS. 1A, 1B and 1C, respectively.
Figures 1B, 1E:
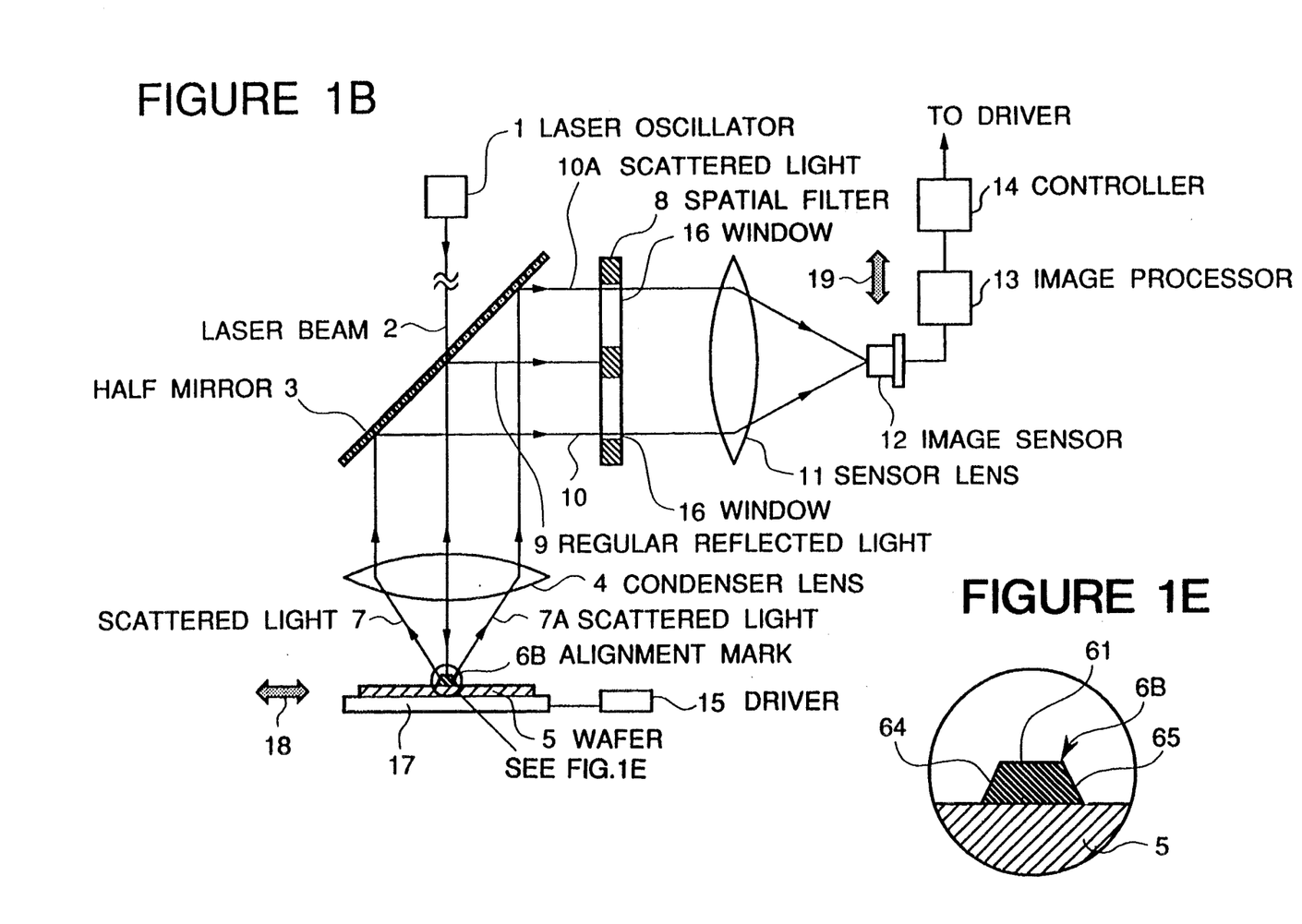
Figures 1C, 1F:
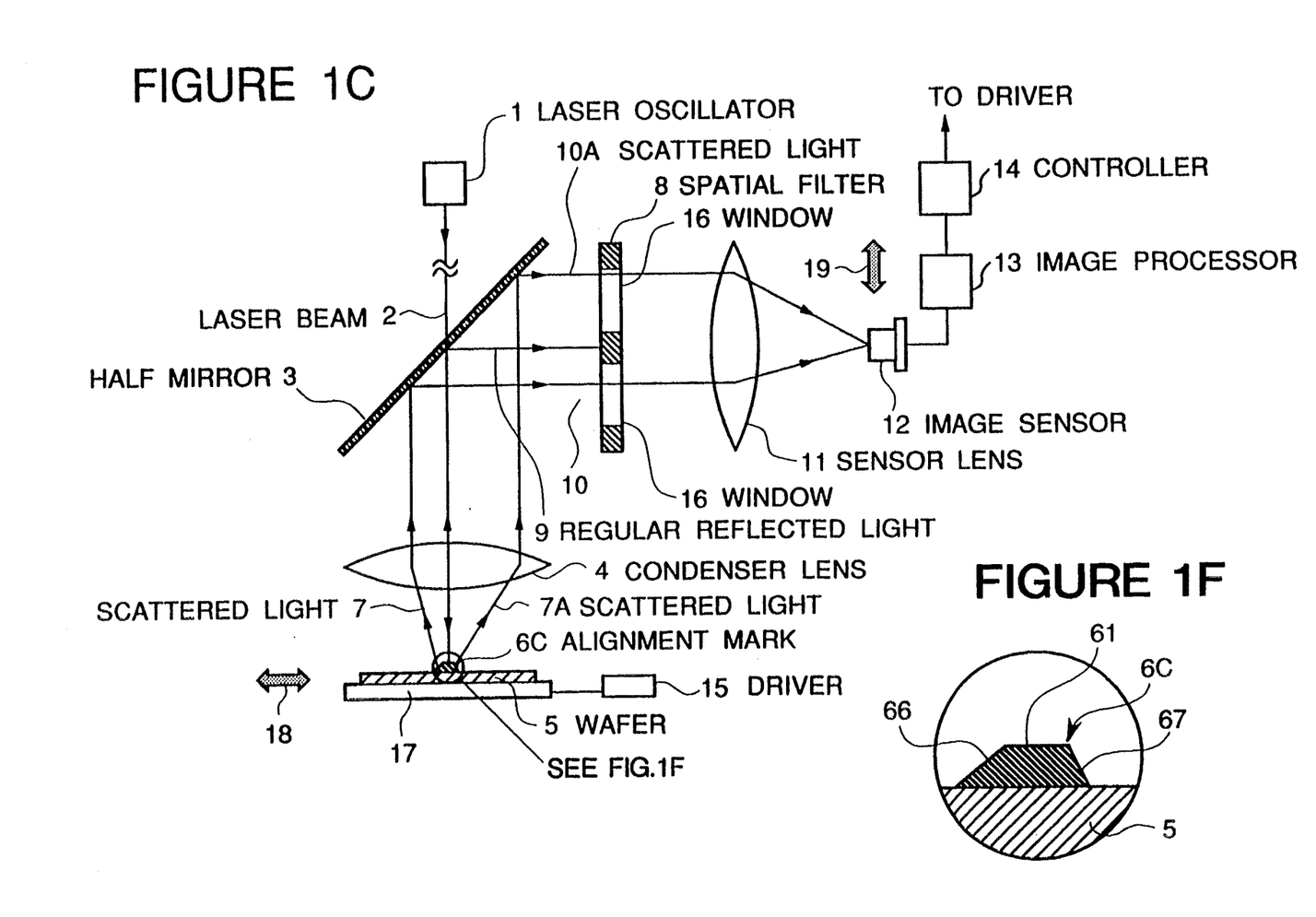

Referring to FIGS. 1A, 1B and 1C, there are shown diagrams of one embodiment of the mark position determining apparatus in accordance with the present invention. The mark position determining apparatuses shown in FIGS. 1A, 1B and 1C are the same, excluding the alignment marks located therein. Accordingly, the mark position determining apparatus in accordance with the present invention will be explained with reference to FIG. 1A.

The mark position determining apparatus shown in FIG. 1A includes a light source composed of a laser oscillator 1. On the other hand, a wafer 5 having an alignment mark 6A is supported on a stage 17, which is for example driven by a driver 15. The alignment mark 6A shown in FIG. 1A and also alignment marks 6B and 6C shown in FIGS. 1B and 1C are a projection which is formed on the wafer 5. The alignment mark 6A has an center flat surface 61 (FIGS. 1D, 1E, 1F) and a pair of side surfaces 62 and 63 at opposite sides of the center flat surface 61. The stage 17 is so located that a laser beam 2 emitted from the laser oscillator 1 passes through a half mirror 3 located at an angle of 45° to the axis of the laser beam 2, and through a condenser lens 4, so that the laser beam 2 is gathered and focused by the condenser lens 4 onto the alignment mark 6A of the wafer 5 supported on the stage 17.

The light reflected and scattered by the alignment mark 6A passes through the condenser lens 4 again, and reflected by the half mirror 3 toward a spatial filter 8, which has a pair of relatively large windows 16. In other words, as will be well understood from the explanation made hereinafter, the pair of relatively large windows 16 have such a size and a position as to block only the regular reflected light reflected from the center flat surface 61 of the alignment mark 6A, but to allow passage of the other reflected and scattered lights from the alignment mark 6A excluding the regular reflected light.

The light having passed through the windows 16 of the spatial filter 8 is gathered and focused by a sensor lens 11 onto an area or two-dimensional image sensor 12. An image signal generated by the image sensor 12 is supplied to an image processor 13, which operates to obtain a light intensity distribution of the image signal in a direction of an arrow 19. The image processor 13 discriminates whether or not a plurality of light intensity peaks included in the obtained light intensity distribution are substantially in symmetry. When the light intensity peaks are substantially in symmetry, the image processor 13 determines that a symmetry point is a center position of the alignment mark, and generates a signal indicative of the center position of the alignment mark. This signal is supplied to a controller 14, which controls the driver 15 so that the driver 15 displaces the stage 17 and hence the wafer 5 supported thereon for example in a horizontal direction 18 in FIG. 1A. Here, the arrow 19 corresponds to the arrow 18 relative to the wafer 5.

Figure 2:
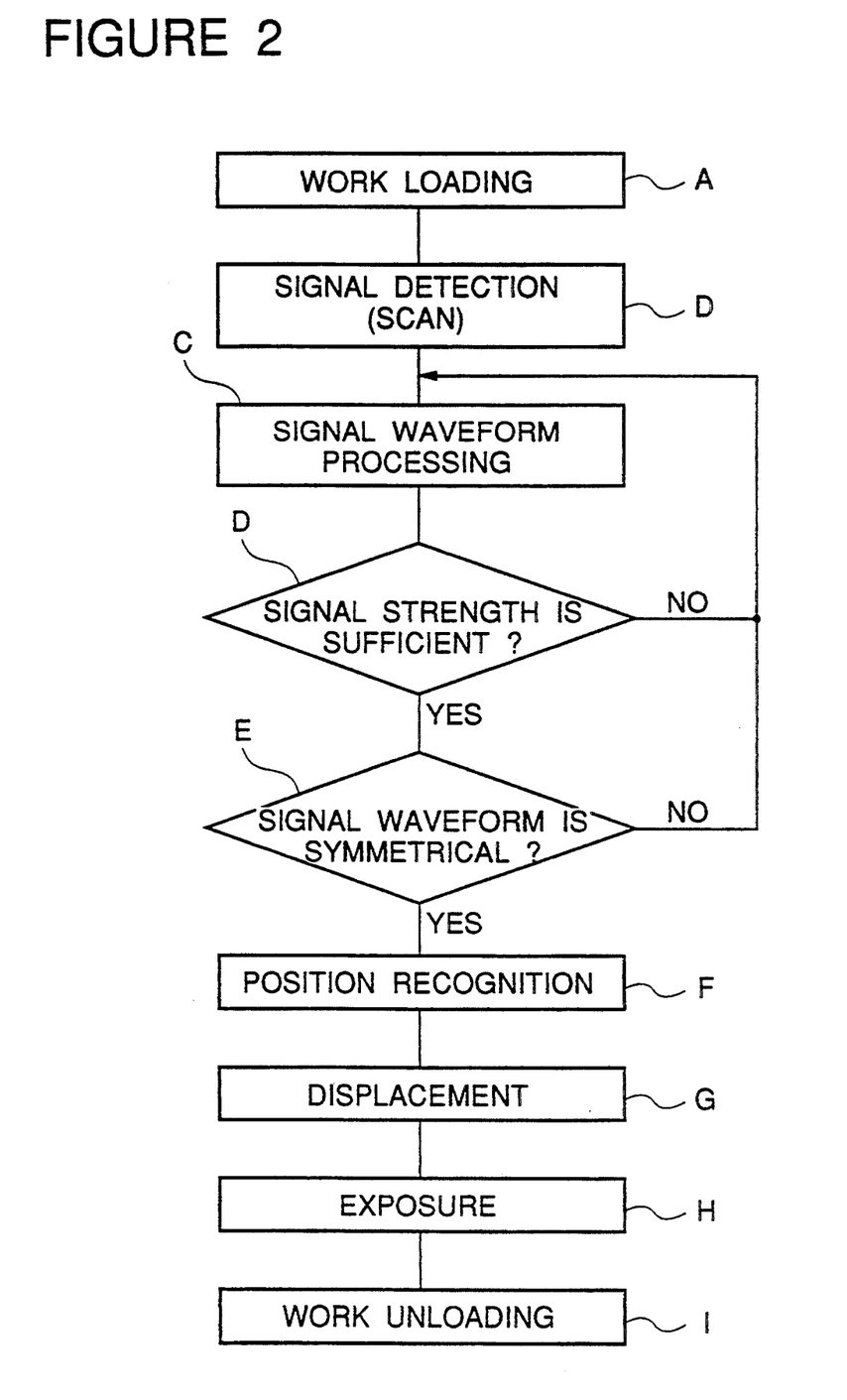
FIG. 2 is a flow chart illustrating a mark position determining process performed using the mark position determining apparatus in accordance with the present invention.

Now, operation will be explained with reference to FIG. 1A and FIG. 2, which is a flow chart illustrating a mark position determining process performed using the mark position determining apparatus in accordance with the present invention.

In a step A, the wafer 5 having the alignment mark 6A is placed on the stage 17. In a step B, the laser oscillator 1 is powered on so that the laser beam 2 is emitted from the laser oscillator 2 and passes through the half mirror 3 and the condenser lens 4 so that the laser beam 2 is focused onto the alignment mark 6A of the wafer 5. In this step B, if the laser beam 2 is not focused onto the alignment mark 6A, either the laser oscillator 1 or the wafer 5 and hence the stage 17 is displaced in the horizontal direction 18. For example, a rough position adjustment is performed to displace the stage 17 in the horizontal direction 18 until the laser beam 2 becomes focused onto the alignment mark 6A.

The laser beam 2 projected on the alignment mark 6A is reflected and scattered in accordance with a shape and a size of the alignment mark 6A. A regular reflected light 9 reflected by the center flat surface 61 of the alignment mark 6A is reflected by the half mirror 3 toward the spatial filter 8, but is blocked by the spatial filter 8, since the regular reflected light 9 is an obstacle for a signal detection in the dark-field alignment. On the other hand, scattered lights 7 and 7A reflected by the side surfaces 62 and 63 of the alignment mark 6A are reflected by the half mirror 3 toward the spatial filter 8, and pass through the windows 16 of the spatial filter 8 so that the scattered lights 7 and 7A are focused onto the image sensor 12 by the sensor lens 11.

Figure 3A:
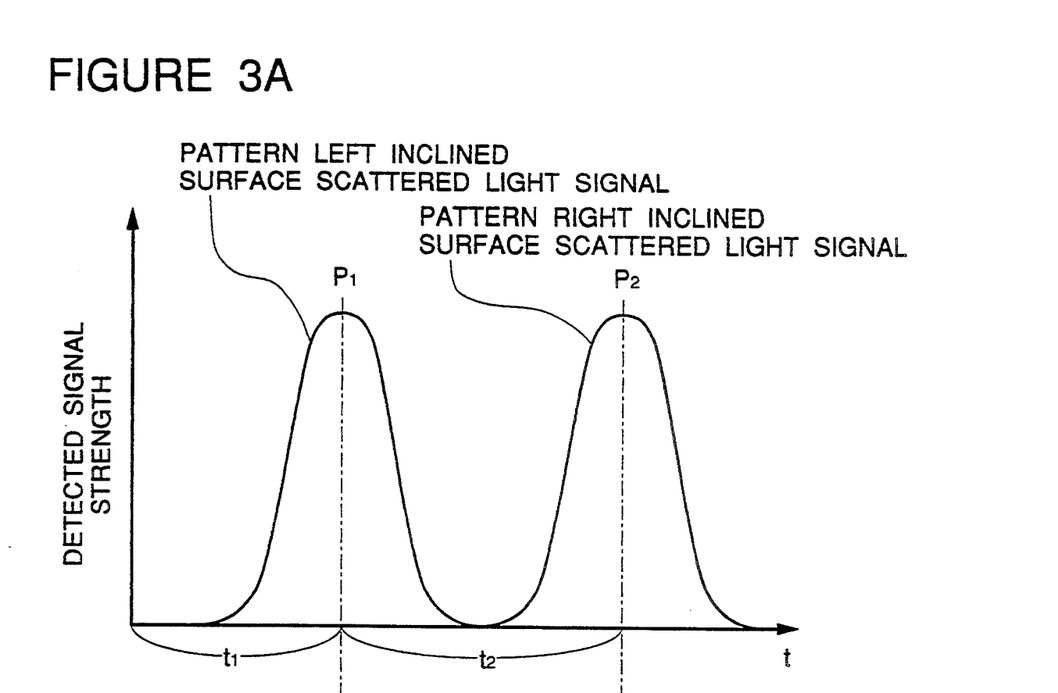
FIGS. 3A and 3B are waveform diagrams illustrating a waveform of the detected scattered image signal and a positioning signal obtained on the basis of the detected scattered light signal.

In a step C, the scattered lights 7 and 7A focused onto the image sensor 12 are converted into an electric image signal by the image sensor 12, and the image signal is supplied to the image processor 13. In the image processor 13, a signal component corresponding to the light from places other than the side surfaces 62 and 63 of the alignment mark 6A is removed by a filtering processing, and a signal strength waveform or distribution having a plurality of peaks, ordinarily a pair of peaks, is obtained. Referring to FIG. 3A, there is shown one example of the signal strength waveform obtained.

In the image processor, furthermore, the peaks of the signal strength waveform obtained are compared with a predetermined reference peak level, in order to determine whether or not the signal strength is sufficient (Step D). If the peaks of the signal strength waveform obtained are higher than the predetermined reference peak level, whether or not the plurality of peaks are in symmetry is discriminated (Step E). However, if the peaks of the signal strength waveform obtained are not higher than the predetermined reference peak level, or if the plurality of peaks are not in symmetry, the processing is returned to the step C, so that a condition of the filtering processing for the obtained image signal is modified or changed, and thereafter, the steps D and E are repeated.

If the necessary conditions are fulfilled in the steps D and E, the position determining processing is performed in a step F. This position determining processing can be performed for example in two different manners as follows.

Figure 3B:
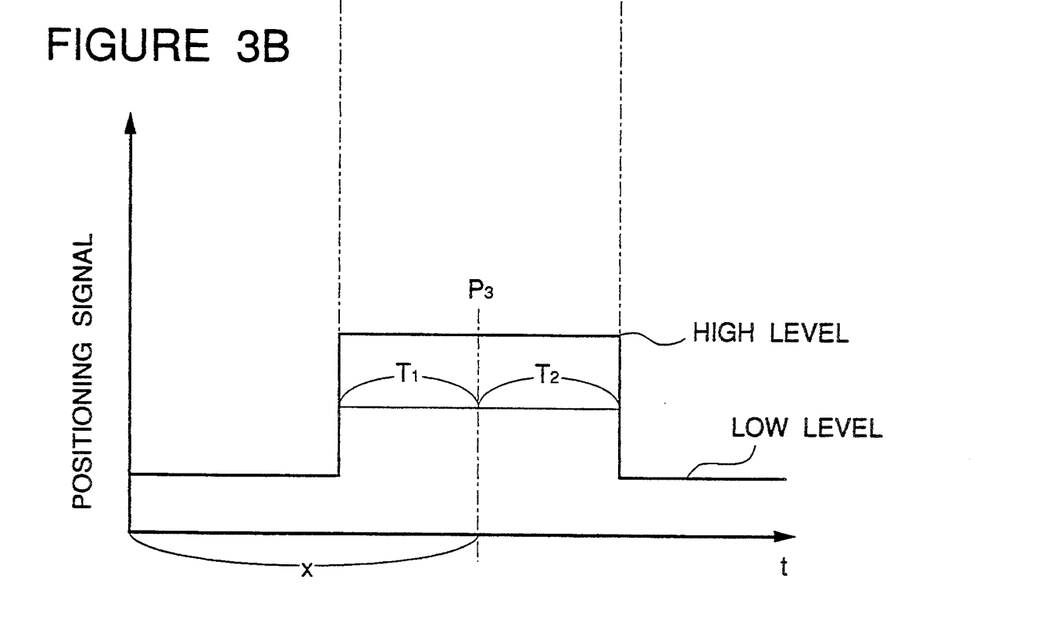

In a first manner, since the image sensor is a scan type area or two dimensional sensor, if the image signal is accumulated or summed for each horizontal scan line, it is possible to obtain a strength signal which varies in a vertical scan line direction as shown in FIG. 3A. In the graphs of FIGS. 3A and 3B, the axis of abscissas shows a vertical scanning time of the image sensor 12. A pair of maximum strength points $P_1$ and $P_2$ are determined in the signal strength waveform. These maximum strength points $P_1$ and $P_2$ are considered to correspond to the pair of side surfaces 62 and 63 of the alignment mark 6A. Then, a time $t_1$ from a scan starting until a first maximum strength point $P_1$ is sought, and also, a time $t_2$ from the first maximum strength point $P_1$ until a second maximum strength point $P_2$ is sought. The image processor 13 generates a position determining signal in the form of a pulse as shown in FIG. 3B, which has its rising edge at the time $t_1$ and its falling edge at the time $t_2$. A center of a high level period of the position determining signal is considered to a time difference "x" from a starting time of the scanning required for a positioning operation until it reaches a center point $P_3$ of the alignment mark 6A. In FIG. 3B, $T_1 = T_2$, and $t_2 = (T_1 + T_2)$. Since the scanning is performed at a constant velocity, a position information can be obtained by multiplying the velocity by the time "x".

In a second manner, since the image signal outputted from the area or two dimensional image sensor includes not only a brightness or strength information but also a positional or coordinate information. Therefore, it is possible to determine a pair of scattered light incident zones having a relatively high light intensity, and to obtain an XY coordinate position of a maximum strength point within each of the scattered light incident zones having a relatively high light intensity. In addition, it is also possible to determine an XY coordinate position of a precisely intermediate point between a pair of maximum strength points.

Thus, the controller 14 can recognize the position to be adjusted. In a step G, the controller 14 controls the driver 15 on the basis of the recognized position so that the driver 15 displaces the stage 18 and hence the wafers. Accordingly, the positioning operation is completed.

In a step H, an exposure pattern is copied or printed on the wafer, and in a step I, the exposed wafer is removed form the stage 18. Thus, the exposure operation is completed.

In the above mentioned embodiment, the stage is displaced only in one direction for simplification, but, actually, the stage position adjustment is performed in both an X direction and a Y direction orthogonal to each other, and thereafter, the exposure is performed. In addition, the scattered light has been utilized for the position determining, but a diffraction light or a reflected light from the alignment mark can be also used for the position determining.

Referring to FIGS. 1B and 1C, FIG. 1B shows an alignment mark 6B having a pair of sharply inclined side surfaces 64 and 65, and FIG. 1C shows an alignment mark 6C having a pair of asymmetric inclined side surfaces 66 and 67. In both cases, the scattered lights 10 and 10A reflected from the sharply inclined side surfaces 64 and 65 and the asymmetric inclined side surfaces 66 and 67 pass through the pair of relatively large windows 16 of the file spatial filter 8 so as to enter the image sensor. Therefore, if the steps A to I are performed, the position of the center of the alignment marks 6B and 6C can be determined, similarly to the alignment mark 6A shown in FIG. 1A.

Figure 4A:
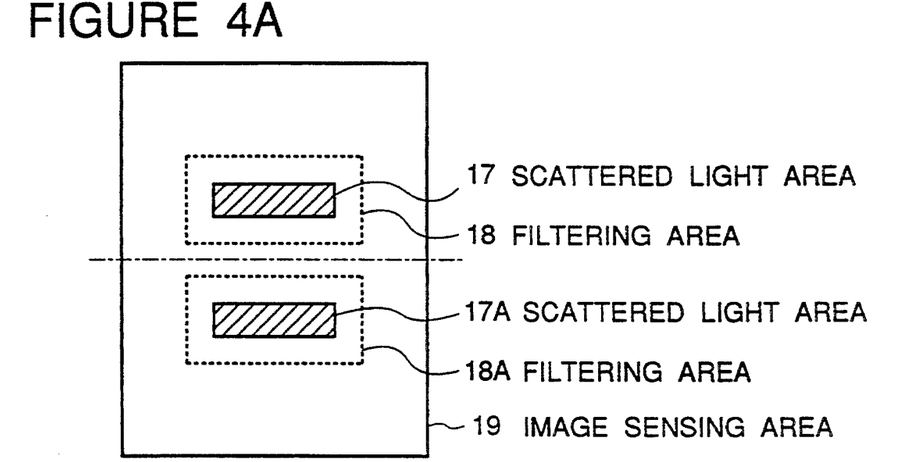
FIGS. 4A, 4B and 4C are diagrams illustrating three different examples of the relation between an image sensing area of the image sensor and the scattered light incident area.
Figure 4B:
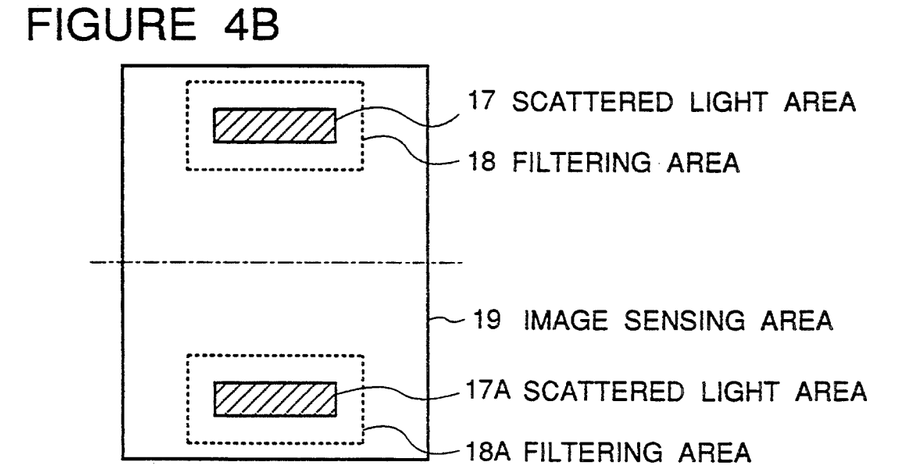
Figure 4C:
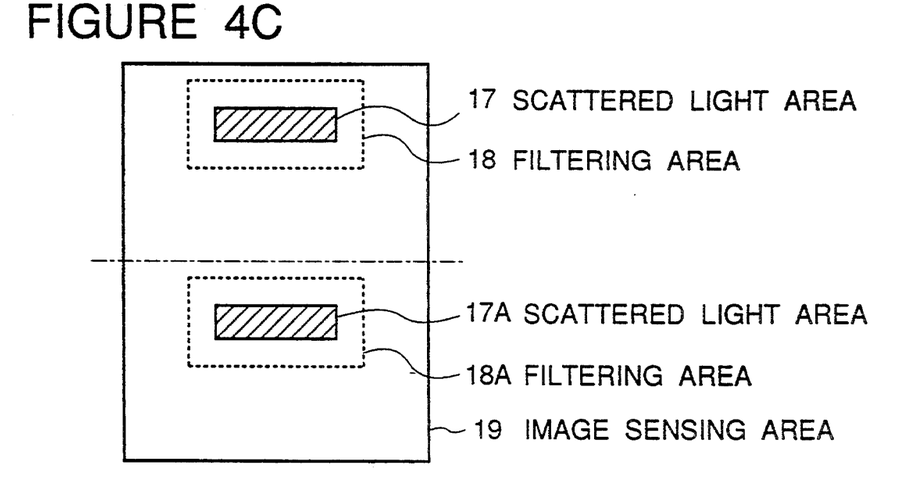

Now, the filtering processing performed in the image processor 13 will be explained with reference to FIGS. 4A, 4B and 4C, which illustrate three different examples of the relation between an image sensing area of the image sensor 12 and the scattered light incident area. In FIGS. 4A, 4B and 4C, hatched zones show an incident area of a scattered light portion having a relatively high light intensity.

FIG. 4A corresponds to the alignment mark 6A shown in FIG. 1A. The scattered lights 10 and 10A from the alignment mark 6A are gathered or focused onto two areas 17 and 17A within an image sensing area 19 of the image sensor 12. Therefore, there are defined two filtering areas 18 and 18A which are sufficiently larger than the scattered light incident areas 17 and 17A and which are located to contain therein the scattered light incident areas 17 and 17A. In the step C, a signal required for the position determining can be obtained by removing the image signals other than the filtering areas 18 and 18B. When the processing is returned to the step C because the peaks of the signal strength waveform obtained are not higher than predetermined reference peak level or because the plurality of peaks are not in symmetry, the position (and the size if necessary) of the filtering areas 18 and 18A is changed in the image processor 13, and the processing is repeated from the step C. In any cases, if the signal processing is performed in the image processor 13 to obtain the result that a pair of scattered light incident areas 17 and 17A having a relatively high light intensity and a pair of filtering areas 18 and 18B are completely included in the image sensing area 19 of the image sensor 12 and each of the scattered light incident areas 17 and 17A is positioned at a center of a corresponding one of the filtering areas 18 and 18B, an intermediate point between the scattered light incident areas 17 and 17A can be considered to be a center point of the alignment mark. Therefore, the processing of the step C is repeated by changing the shape, the size and/or the position of one or the other of the the filtering areas 18 and 18B until there is obtained the result that a pair of scattered light incident areas 17 and 17A having a relatively high light intensity and a pair of filtering areas 18 and 18B are completely included in the image sensing area 19 of the image sensor 12 and each of the scattered light incident areas 17 and 17A is positioned at a center of a corresponding one of the filtering areas 18 and 18B.

As will be understood from FIGS. 1A, 1B and 1C, in order for the image sensor 12 to surely receive the scattered lights 10 and 10A even if the size and the shape of the alignment marks 6A, 6B and 6C change or vary to some extent, the windows 16 of the spatial filter 8 are sufficiently larger than that of the conventional spatial filter. Because of this, an ambient and spurious lights other than the light component that is necessary for the position determining, enter to the image sensor 12. However, the signal component corresponding to the ambient and spurious lights are removed in the step C, and therefore, the large windows 16 of the spatial filter 8 does not cause any disadvantage.

Incidentally, if no peak cannot be detected, this means that the alignment mark is not properly located in a rough position adjustment. In this case, the rough position adjustment of the wafer 5 is carried out again, and thereafter, the above mentioned position determining operation is performed.

The above mentioned embodiment is directed to the mark position determining. However, if the alignment mark is replaced by a developed resist pattern or an etched insulator or conductor pattern, the above mentioned apparatus can measure a width or a length of the developed or etched pattern, since the developed or etched pattern has a center flat surface and a pair of side surfaces. In the case of measuring the width of the developed or etched pattern, a distance between respective center points of the scattered light incident areas 17 and 17A having a relatively high light intensity is sought. In the case of measuring the length of the developed or etched pattern, it it necessary to displace the stage, and the amount of displacement of the stage is added to the result obtained by the above mentioned apparatus.

The invention has thus been shown and described with reference to the specific embodiments. However, it should be noted that the present invention is in no way limited to the details of the illustrated structures but changes and modifications may be made within the scope of the appended claims.

I claim:

1. A mark position determining apparatus including a means for projecting a light onto a mark which is formed on a substrate and which has a center flat surface and a pair of side surfaces, said mark having any one of a plurality of sizes and/or shapes, means comprising a spatial filter having areas located to block a light reflected from said center flat surface of said mark, said spatial filter having a pair of windows areas for allowing a passage of substantially all scattered lights reflected from said side surfaces of said mark regardless of which of said sizes and/or shapes of said mark may be present, an image sensor located to receive the scattered lights which have passed through said spatial filter, so as to generate an image signal, and an image processor means responsive to said received image signal for obtaining a light intensity distribution of said image signal, and for discriminating whether or not a plurality of light intensity peaks included in the obtained light intensity distribution are substantially in symmetry, said image processor means operating to determine that a symmetry point is a center position of said mark when the light intensity peaks are substantially in symmetry, said image processor means being configured to prevent signals caused by stray light from being included in the signal obtained from the received image signal, a signal component corresponding to the stray light entering in places other than said filter window areas which are sufficiently larger than incident areas of a scattered light portion having a relatively high light intensity and which are located to contain therein the incident areas of the scattered light portion having the relatively high light intensity.

2. A mark position determining apparatus claimed in claim 1 wherein said means for projecting the light onto said mark is constituted of a laser oscillator emitting a laser beam toward said mark, and further including a half mirror located between said laser oscillator and said substrate on a path of said laser beam and inclined to said path of said laser beam, and a condenser lens located between said half mirror and said substrate for gathering and focusing said laser beam onto the said mark.

3. A determining apparatus including a means for projecting a light onto a mark which is formed on a substrate and which has a center flat surface and a pair of side surfaces said mark having any one of a plurality of sizes and/or shapes, means comprising a spatial filter located to block a light reflected from said center flat surface of said mark, said spatial filter having a pair of windows allowing a passage of substantially all scattered lights reflected from said side surfaces of said mark regardless of which of the sizes and/or shapes of said mark may be present, an area image sensor located to receive the scattered lights which have passed through said spatial filter, so as to generate an image signal, and an image processor receiving said image signal and configured to omit from the received image signal a signal component corresponding to the light entering to places other than filtering areas which are sufficiently larger than incident areas of a scattered light portion having a relatively high light intensity and which are located to contain therein the incident areas of the scattered light portion having the relatively high light intensity, said image processor operating to determine a center position of the scattered light portion having the relatively high light intensity.

4. A mark position determining apparatus claimed in claim 3 wherein said image processor is configured to obtain a light intensity distribution of said image signal, and to discriminate whether or not a plurality of light intensity peaks included in the obtained light intensity distribution are substantially in symmetry, said image processor operating to determine that a symmetry point is a center position of said mark when the light intensity peaks are substantially in symmetry.

* * * * *